(12) United States Patent
Wang et al.

(10) Patent No.: US 12,550,547 B2
(45) Date of Patent: Feb. 10, 2026

(54) DISPLAYING BASE PLATE AND DISPLAYING DEVICE

(71) Applicants: Chengdu BOE Optoelectronics Technology Co., Ltd., Sichuan (CN); BOE Technology Group Co., Ltd., Beijing (CN)

(72) Inventors: Miao Wang, Beijing (CN); Yunsheng Xiao, Beijing (CN); Jingwen Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 930 days.

(21) Appl. No.: 17/780,711

(22) PCT Filed: Jun. 22, 2021

(86) PCT No.: PCT/CN2021/101645
§ 371 (c)(1),
(2) Date: May 27, 2022

(87) PCT Pub. No.: WO2022/266860
PCT Pub. Date: Dec. 29, 2022

(65) Prior Publication Data
US 2024/0164155 A1   May 16, 2024

(51) Int. Cl.
*H10K 59/131*   (2023.01)

(52) U.S. Cl.
CPC .................. *H10K 59/131* (2023.02)

(58) Field of Classification Search
None
See application file for complete search history.

(56) References Cited

U.S. PATENT DOCUMENTS

| 11,348,992 | B2 * | 5/2022 | Oh ..................... H10K 59/1213 |
| 2004/0217479 | A1 | 11/2004 | Katsura et al. |
| 2012/0056252 | A1 | 3/2012 | Aoki et al. |
| 2015/0206931 | A1 | 7/2015 | Choi et al. |

(Continued)

FOREIGN PATENT DOCUMENTS

| CN | 104393018 A | 3/2015 |
| CN | 105870105 A | 8/2016 |

(Continued)

*Primary Examiner* — Bradley Smith
(74) *Attorney, Agent, or Firm* — WHDA, LLP

(57) ABSTRACT

A displaying base plate and a displaying device, the displaying base plate includes a first sub-pixel unit and a second sub-pixel unit that are arranged adjacently, a substrate, and a first metal layer, a first insulating layer and a second metal layer that are arranged in stack on one side of the substrate. The first metal layer includes a first electrode block connected to a constant potential. The second metal layer includes signal lines and connecting lines; the signal lines include a first signal line and a second signal line; the connecting lines include a first connecting line and a second connecting line; the first signal line is connected to a driving circuit of the first sub-pixel unit, the second signal line is connected to a driving circuit of the second sub-pixel unit.

19 Claims, 6 Drawing Sheets

(56) References Cited

U.S. PATENT DOCUMENTS

| | | | |
|---|---|---|---|
| 2020/0403059 A1 | 12/2020 | Oh et al. | |
| 2021/0367026 A1 | 11/2021 | Xu et al. | |
| 2022/0102459 A1 | 3/2022 | Yang et al. | |
| 2022/0229338 A1 | 7/2022 | Zhu et al. | |
| 2023/0180549 A1* | 6/2023 | Li ........................ | H10K 59/131 |
| | | | 257/40 |

FOREIGN PATENT DOCUMENTS

| | | |
|---|---|---|
| CN | 106896610 A | 6/2017 |
| CN | 110770911 A | 2/2020 |
| CN | 210110769 U | 2/2020 |
| CN | 111816686 A | 10/2020 |
| CN | 112017593 A | 12/2020 |
| CN | 112117284 A | 12/2020 |
| CN | 112859463 A | 5/2021 |
| JP | 2012-234210 A | 11/2012 |
| KR | 100699999 B1 | 3/2007 |
| KR | 20190113708 A | 10/2019 |

* cited by examiner

DISPLAYING BASE PLATE AND DISPLAYING DEVICE

CROSS REFERENCE TO RELEVANT DISCLOSURES

The application is a national stage of PCT application PCT/CN2021/101645 field on Jun. 22, 2021 and entitled "DISPLAYING BASE PLATE AND DISPLAYING DEVICE".

TECHNICAL FIELD

The present disclosure relates to the technical field of displaying, and particularly relates to a displaying base plate and a displaying device.

BACKGROUND

Currently, with the rapid development of intellectualization, demands and expectations of the market on smart-terminal displaying devices are getting higher and higher, the size of mobile phones and tablet personal computers is also getting bigger and bigger, and more diversified application scenarios make people desire to enjoy visual experience of higher resolutions while chasing full screens.

SUMMARY

The present disclosure provides a displaying base plate, wherein the displaying base plate comprises a plurality of sub-pixel units, the plurality of sub-pixel units include a first sub-pixel unit and a second sub-pixel unit that are arranged adjacently, and the displaying base plate comprises a substrate, and a first metal layer, a first insulating layer and a second metal layer that are arranged in stack on one side of the substrate:
  the first metal layer comprises a first electrode block, and the first electrode block is connected to a constant potential;
  the second metal layer comprises signal lines and connecting lines;
  the signal lines include a first signal line and a second signal line;
  the connecting lines include a first connecting line and a second connecting line;
  the first signal line is connected to a driving circuit of the first sub-pixel unit, the second signal line is connected to a driving circuit of the second sub-pixel unit, the first connecting line is located inside the first sub-pixel unit, and the second connecting line is located inside the second sub-pixel unit; and
  a shielding signal line is provided between the first signal line and the second connecting line, and the shielding signal line is connected to the first electrode block.

In an optional implementation, the shielding signal line and the second metal layer are arranged in a same layer, and the shielding signal line and the first electrode block are connected by a via hole provided in the first insulating layer.

In an optional implementation, the shielding signal line and the first metal layer are arranged in a same layer.

In an optional implementation, an orthographic projection of the shielding signal line on the substrate does not overlap with an orthographic projection of the signal lines on the substrate.

In an optional implementation, a direction of extension of the shielding signal line and a direction of extension of the connecting lines are parallel or intersected.

In an optional implementation, an orthographic projection of the shielding signal line on the substrate is a straight line or a curve line.

In an optional implementation, the plurality of sub-pixel units are arranged in an array, a direction of arrangement of columns of the plurality of sub-pixel units is a first direction, and an orthographic projection in the first direction of an orthographic projection of the second connecting line on the substrate overlaps with an orthographic projection in the first direction of an orthographic projection of the shielding signal line on the substrate.

In an optional implementation, the orthographic projection in the first direction of the orthographic projection of the second connecting line on the substrate is located within an area of the orthographic projection in the first direction of the orthographic projection of the shielding signal line on the substrate.

In an optional implementation, in the first direction, a ratio of a length of the overlapping to a length of the orthographic projection in the first direction of the orthographic projection of the second connecting line on the substrate is greater than or equal to 0.5 and less than or equal to 0.8.

In an optional implementation, the plurality of sub-pixel units are arranged in an array, a direction of arrangement of columns of the plurality of sub-pixel units is a first direction, and a length of the shielding signal line in the first direction is greater than or equal to 4 μm and less than or equal to 8 μm.

In an optional implementation, the second metal layer further comprises a power signal line, and the power signal line and the first electrode block are connected by a via hole provided in the first insulating layer.

In an optional implementation, the displaying base plate further comprises an active layer, a second insulating layer, a grid layer and a third insulating layer that are provided in stack between the substrate and the first metal layer, and the first metal layer is provided on one side of the third insulating layer that is away from the substrate;
  the active layer comprises a first channel region, a second channel region and a first resistor region that connects the first channel region and the second channel region, the grid layer comprises a first grid corresponding to the first channel region and a second grid corresponding to the second channel region, and the first grid is connected to the second grid; and
  the first metal layer further comprises a second electrode block, an orthographic projection of the second electrode block on the substrate overlaps with an orthographic projection of the first resistor region on the substrate, and the second electrode block is connected to the shielding signal line.

In an optional implementation, the orthographic projection of the second electrode block on the substrate covers the orthographic projection of the first resistor region on the substrate.

In an optional implementation, the active layer further comprises a second resistor region provided on one side of the second channel region that is away from the first resistor region, and the second resistor region is connected to the second channel region; and the second resistor region and the second connecting line are connected by via holes provided in the first insulating layer, the third insulating layer and the second insulating layer.

In an optional implementation, the active layer further comprises a third channel region, a third resistor region connecting the third channel region and the first channel region, and a fourth resistor region provided on one side of the third channel region that is away from the third resistor region, and the fourth resistor region is connected to the third channel region;

the grid layer further comprises a third grid corresponding to the third channel region, and the third grid and the second connecting line are connected by via holes provided in the first insulating layer and the third insulating layer; and the second signal line and the fourth resistor region are connected by via holes provided in the first insulating layer, the third insulating layer and the second insulating layer.

In an optional implementation, an orthographic projection of the third grid on the substrate overlaps with an orthographic projection of the first electrode block on the substrate.

The present disclosure provides a displaying device, wherein the displaying device comprises the displaying base plate according to any one of the above embodiments.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are embodiments of the present disclosure, and a person skilled in the art can obtain other figures according to these figures without paying creative work. It should be noted that the proportions in the drawings are merely illustrative and do not indicate the actual proportions.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
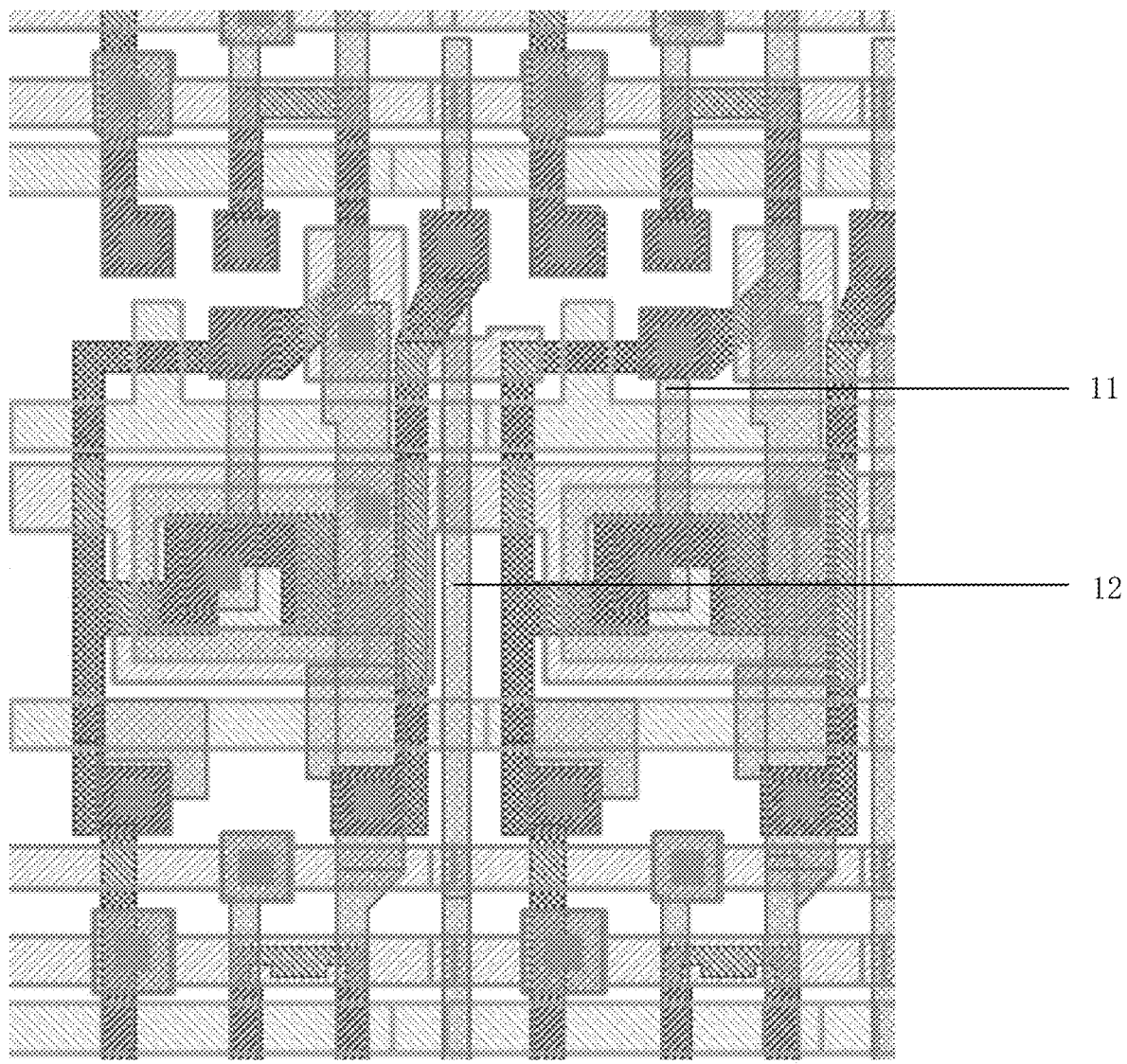
FIG. 1 shows a schematic planar structural diagram of a displaying base plate in the prior art.

In the prior art, as shown in FIG. 1, because the node signal line 11 of a pixel and the data signal line 12 of the neighboring pixel have a coupling capacitor therebetween, the data signal in the data signal line 12 and the node signal in the node signal line 11 have signal interference therebetween, which results in poor uniformity and stability of the displaying brightness.

Figure 2:
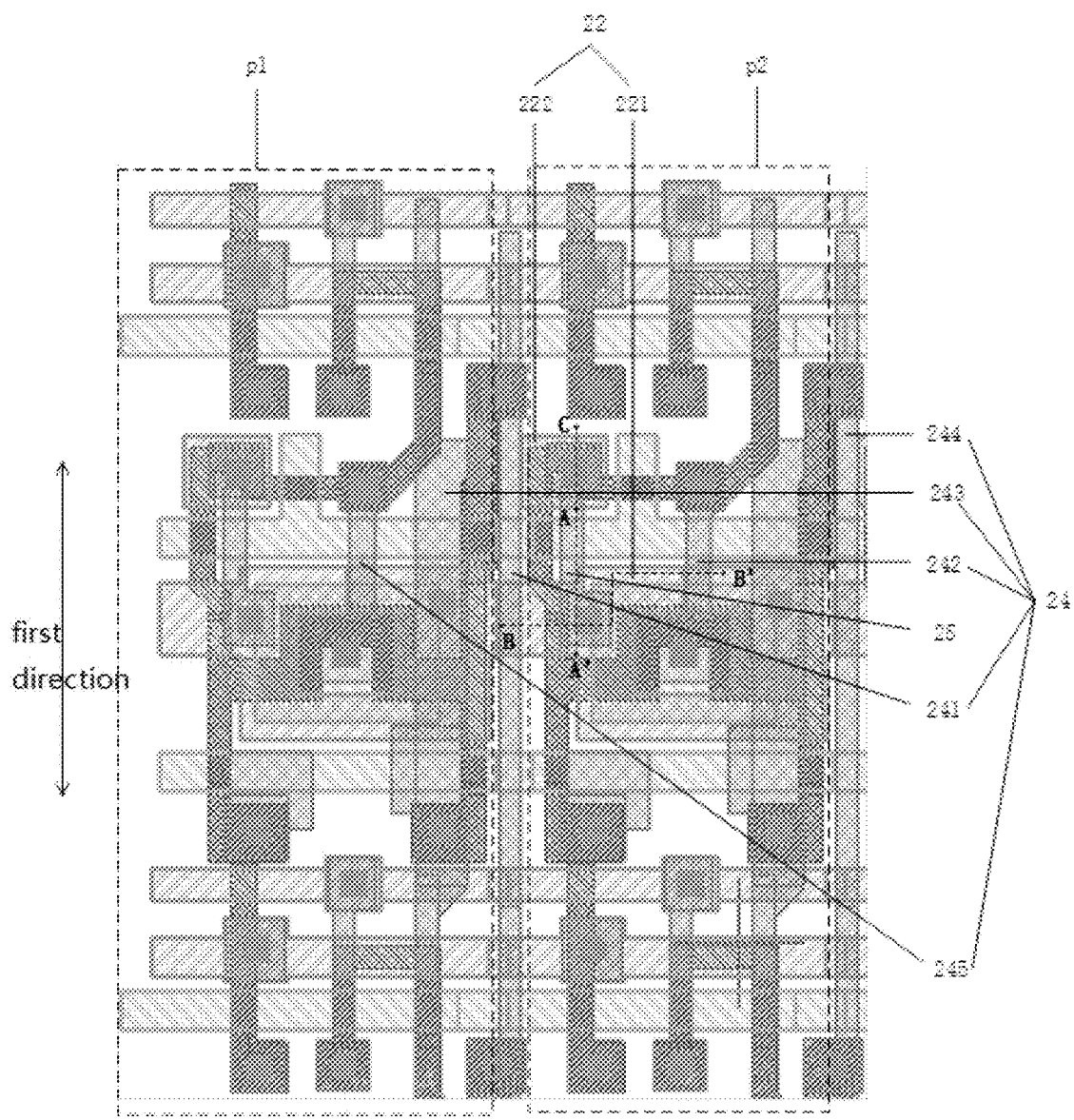
FIG. 2 shows a schematic planar structural diagram of the displaying base plate according to an embodiment of the present disclosure.

In order to solve the above problems, an embodiment of the present disclosure provides a displaying base plate. Referring to FIG. 2, a schematic planar structural diagram of the displaying base plate according to an embodiment of the present disclosure is shown. As shown in FIG. 2, the displaying base plate comprises a plurality of sub-pixel units, and the plurality of sub-pixel units include a first sub-pixel unit p1 and a second sub-pixel unit p2 that are arranged adjacently.

Figure 3:
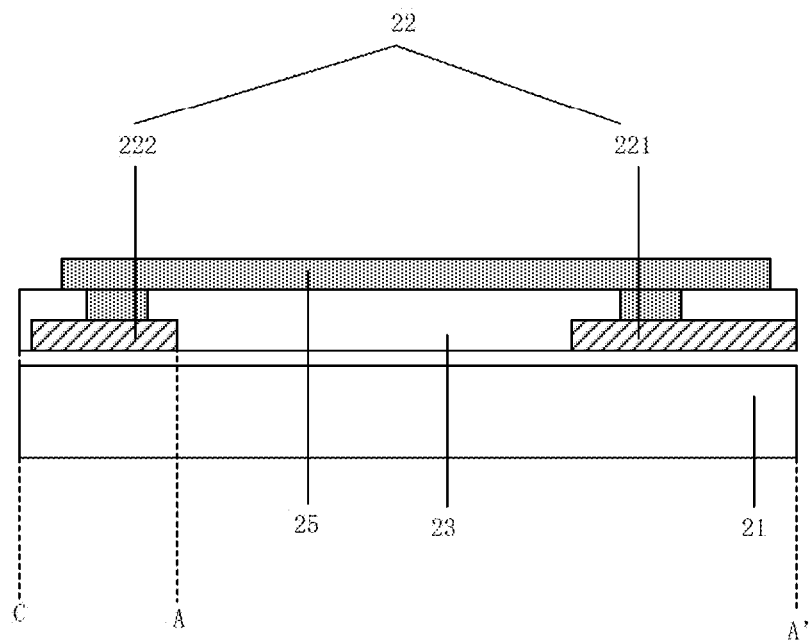
FIG. 3 shows a schematic sectional structural diagram of the displaying base plate according to an embodiment of the present disclosure at a first position.
Figure 4:
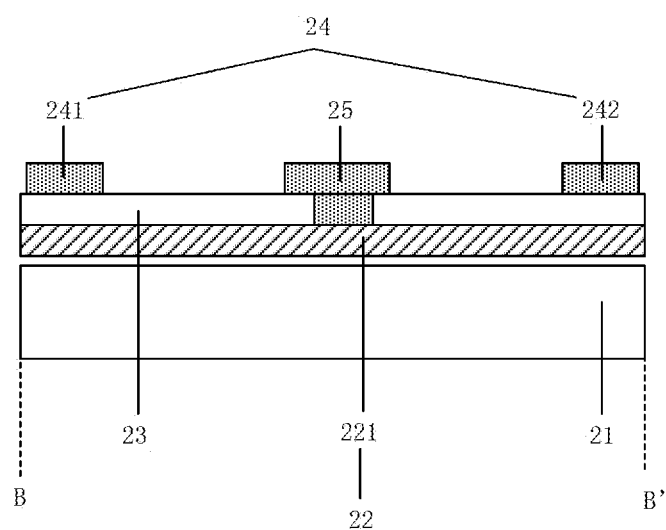
FIG. 4 shows a schematic sectional structural diagram of the displaying base plate according to an embodiment of the present disclosure at a second position.

Referring to FIG. 3, a schematic sectional structural diagram of the displaying base plate in FIG. 2 along CA' is shown. Referring to FIG. 4, a schematic sectional structural diagram of the displaying base plate in FIG. 2 along BB' is shown.

As shown in FIGS. 3 and 4, the displaying base plate comprises a substrate 21, and a first metal layer 22, a first insulating layer 23 and a second metal layer 24 that are arranged in stack on one side of the substrate 21.

The first metal layer 22 comprises a first electrode block 221, and the first electrode block 221 is connected to a constant potential.

Referring to FIG. 2, the second metal layer 24 comprises signal lines and connecting lines. The signal lines include a first signal line 241 and a second signal line 244. The connecting lines include a first connecting line 245 and a second connecting line 242. The first signal line 241 is connected to the driving circuit of the first sub-pixel unit p1, the second signal line 244 is connected to the driving circuit of the second sub-pixel unit p2, the first connecting line 245 is located inside the first sub-pixel unit p1, and the second connecting line 242 is located inside the second sub-pixel unit p2.

Referring to FIGS. 2 and 4, a shielding signal line 25 is provided between the first signal line 241 and the second connecting line 242, and the shielding signal line 25 is connected to the first electrode block 221.

The shielding signal line 25 is used to shield the signal coupling between the first signal line 241 and the second connecting line 242, to prevent interference on the signal in the second connecting line 242 by the signal in the first signal line 241.

In the present embodiment, the first metal layer 22 may be provided closer to the substrate 21, as shown in FIGS. 3 and 4, and the second metal layer 24 may be provided closer to the substrate 21, which is not limited in the present embodiment.

In order to realize that the first electrode block 221 is connected to a constant potential, in an optional implementation, as shown in FIG. 2, the second metal layer 24 may further comprise a power signal line 243, and the power signal line 243 and the first electrode block 221 are connected by a via hole provided in the first insulating layer 23. Accordingly, the first electrode block 221 can be connected to a constant power-supply voltage signal, such as VDD.

It should be noted that the constant potential connected to the first electrode block 221 may also be a ground electric potential and so on, which is not limited in the present embodiment.

In a particular implementation, the shielding signal line 25 and the first electrode block 221 may have multiple modes of connection therebetween.

In an optional implementation, the shielding signal line 25 and the first metal layer 22 may be arranged in the same layer, and the shielding signal line 25 and the first electrode block 221 are in contacted connection. In the present implementation, the shielding signal line 25 and the first electrode block 221 may be of an integral structure.

In another optional implementation, as shown in FIG. 4, the shielding signal line 25 and the second metal layer 24 may be arranged in the same layer, or, in other words, the shielding signal line 25, the first signal line 241 and the second connecting line 242 are arranged in the same layer, and the shielding signal line 25 and the first electrode block 221 are connected by a via hole provided in the first insulating layer 23. Because the shielding signal line 25, the first signal line 241 and the second connecting line 242 are arranged in the same layer, so as to better shield the signal interference between the first signal line 241 and the second connecting line 242.

In the present implementation, the material of the shielding signal line 25 may be the same as the materials of the first signal line 241 and the second connecting line 242, whereby the shielding signal line 25, the first signal line 241 and the second connecting line 242 can be formed at the same time.

In the displaying base plate according to the present embodiment, by providing the shielding signal line 25 connected to the first electrode block 221, the electric potential on the shielding signal line 25 can be a constant potential. Furthermore, because the shielding signal line is disposed between the first signal line 241 and the second connecting line 242, the shielding signal line 25 can effectively prevent formation of a coupling capacitor between the first signal line 241 and the second connecting line 242 of neighboring sub-pixel units, to prevent interference on the signal in the second connecting line 242 by the signal in the first signal line 241, to improve the uniformity and the stability of the displaying.

In an optional implementation, as shown in FIG. 2, the orthographic projection of the shielding signal line 25 on the substrate 21 does not overlap with the orthographic projection of the signal line (including the first signal line 241 and the second signal line 244) on the substrate 21. Formation of a coupling capacitor between the shielding signal line 25 and the signal line can be prevented, and interference on the signal in the signal line by the shielding signal line 25 can be also better prevented.

In the present embodiment, the direction of extension of the shielding signal line 25 and the direction of extension of the connecting line (including the first connecting line 245 and the second connecting line 242) may be parallel (as shown in FIG. 2) or intersect, which is not limited in the present embodiment.

In the present embodiment, the orthographic projection of the shielding signal line 25 on the substrate 21 may be a straight line (as shown in FIG. 2) or a curve line, which is not limited in the present embodiment. In a particular implementation, the orthographic projection of the shielding signal line 25 on the substrate 21 may be a straight line or curve line that has a certain width (the dimension perpendicular to the direction of extension of the shielding signal line 25).

As shown in FIG. 2, the plurality of sub-pixel units are arranged in an array, the direction of arrangement of the columns of the plurality of sub-pixel units is a first direction, and the orthographic projection in the first direction of the orthographic projection of the second connecting line 242 on the substrate 21 overlaps with the orthographic projection in the first direction of the orthographic projection of the shielding signal line 25 on the substrate 21. In the first direction, the ratio of the length of the overlapping to the length of the orthographic projection in the first direction of the orthographic projection of the second connecting line 242 on the substrate 21 may be greater than or equal to 0.5 and less than or equal to 0.8. Accordingly, the effect of shielding of the shielding signal line can be further improved.

In an optional implementation, as shown in FIG. 2, the orthographic projection in the first direction of the orthographic projection of the second connecting line 242 on the substrate 21 is located within the area of the orthographic projection in the first direction of the orthographic projection of the shielding signal line 25 on the substrate 21. Accordingly, in the first direction, the length of the shielding signal line 25 can entirely cover the length of the second connecting line 242, and therefore it can thoroughly prevent interference on the second connecting line 242 by the signal of the first signal line 241 of the neighboring sub-pixel unit.

In an optional implementation, as shown in FIG. 2, the plurality of sub-pixel units are arranged in an array, the direction of arrangement of the columns of the plurality of sub-pixel units is a first direction, and the length of the shielding signal line 25 in the first direction may be greater than or equal to 4 μm and less than or equal to 8 μm. In a particular implementation, the length of the shielding signal line 25 may be determined according to factors such as the length of the second connecting line 242 and the designing room, and its particular numerical value is not limited in the present embodiment.

In an optional implementation, the displaying base plate may further comprise an active layer 50, a second insulating layer, a grid layer 60 and a third insulating layer that are provided in stack between the substrate 21 and the first metal layer 22, and the first metal layer 22 is provided on the side of the third insulating layer that is away from the substrate 21. Referring to FIGS. 5 to 9, FIGS. 5 to 9 individually show schematic planar structural diagrams of the active layer 50, the grid layer 60, the first metal layer 22, the first insulating layer 23 and the second metal layer 24. Among them, FIG. 8 shows a via-hole region provided in the first insulating layer 23.

Figure 5:
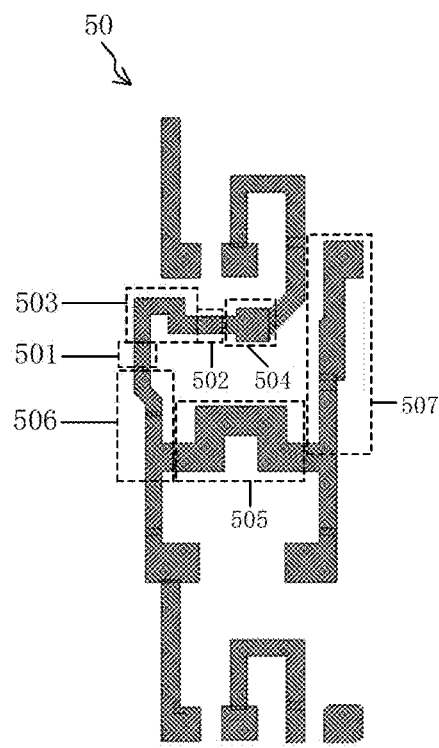
FIG. 5 shows a schematic planar structural diagram of the active layer of the displaying base plate according to an embodiment of the present disclosure.

Referring to FIG. 5, the active layer 50 may comprise a first channel region 501, a second channel region 502 and a first resistor region 503 that connects the first channel region 501 and the second channel region 502. The first resistor region 503 may be formed by conductorizing the corresponding region of the active layer 50.

Figure 6:
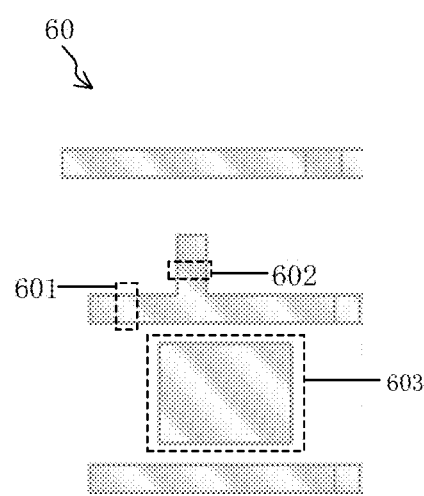
FIG. 6 shows a schematic planar structural diagram of the grid layer of the displaying base plate according to an embodiment of the present disclosure.

Referring to FIG. 6, the grid layer 60 may comprise a first grid 601 corresponding to the first channel region 501 and a second grid 602 corresponding to the second channel region 502, and the first grid 601 is connected to the second grid 602. The orthographic projection of the first grid 601 on the substrate 21 may cover the orthographic projection of the first channel region 501 on the substrate 21. The orthographic projection of the second grid 602 on the substrate 21 may cover the orthographic projection of the second channel region 502 on the substrate 21.

Figure 7:
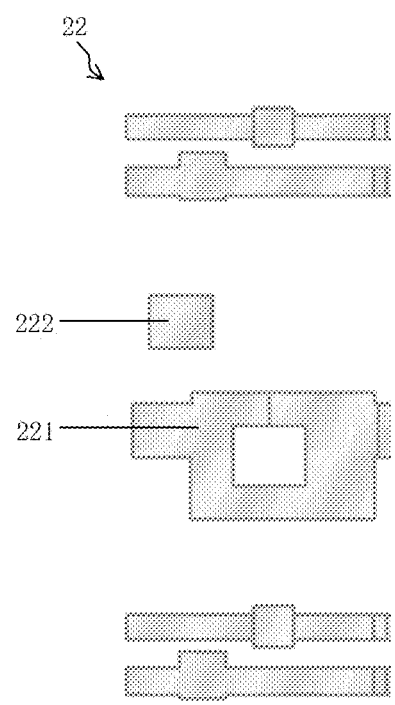
FIG. 7 shows a schematic planar structural diagram of the first metal layer of the displaying base plate according to an embodiment of the present disclosure.
Figure 8:
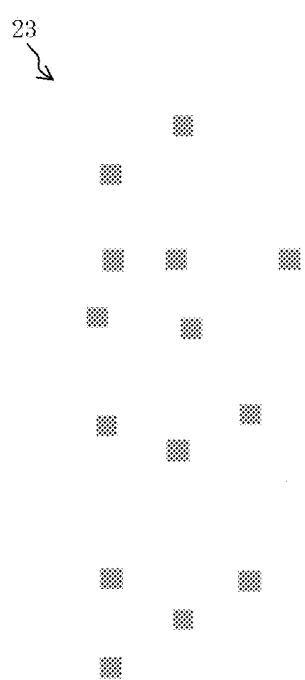
FIG. 8 shows a schematic planar structural diagram of the first insulating layer of the displaying base plate according to an embodiment of the present disclosure.
Figure 9:
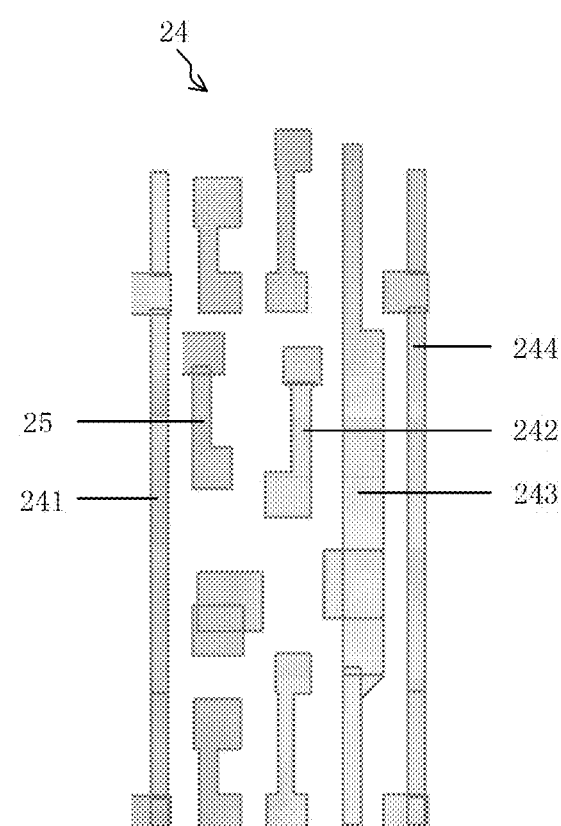
FIG. 9 shows a schematic planar structural diagram of the second metal layer of the displaying base plate according to an embodiment of the present disclosure.

Referring to FIGS. 2, 3 and 7, the first metal layer 22 may further comprise a second electrode block 222, the orthographic projection of the second electrode block 222 on the substrate 21 overlaps with the orthographic projection of the first resistor region 503 on the substrate 21, and the second electrode block 222 is connected to the shielding signal line 25.

In the present implementation, because the orthographic projection of the second electrode block 222 on the substrate 21 overlaps with the orthographic projection of the first resistor region 503 on the substrate 21, the second electrode block 222 and the first resistor region 503 form a coupling capacitor therebetween. In addition, because the shielding signal line 25 is connected to the first electrode block 221 and the second electrode block 222, and the first electrode block 221 is connected to a constant potential, the electric potential of the second electrode block 222 is constant. In other words, one of the polar plates of the coupling capacitor is a constant potential, whereby the voltage of the other polar plate, i.e., the first resistor region 503, can be maintained stable.

In a particular implementation, the shielding signal line 25 and the second electrode block 222 may have multiple modes of connection therebetween. In an optional implementation, the shielding signal line 25 and the first metal layer 22 may be arranged in the same layer, and the shielding signal line 25 is in contacted connection with the first electrode block 221 and the second electrode block 222.

In another optional implementation, as shown in FIGS. 3 and 4, the shielding signal line and the second metal layer 24 may be arranged in the same layer, or, in other words, the shielding signal line 25, the first signal line 241 and the second connecting line 242 are arranged in the same layer, and the shielding signal line 25 is connected to the first electrode block 221 and the second electrode block 222 individually by a via hole provided in the first insulating layer 23.

In order to further improve the effect of voltage stabilization on the first resistor region 503 by the second electrode block 222, the orthographic projection of the second electrode block 222 on the substrate 21 may cover the orthographic projection of the first resistor region 503 on the substrate 21.

It should be noted that, in order to prevent influence by the second electrode block 222 on the signals in the first channel region 501, the second channel region 502, the first grid 601 and the second grid 602, the orthographic projection of the second electrode block 222 on the substrate 21 may not overlap with the orthographic projections of individually the first channel region 501, the second channel region 502, the first grid 601 and the second grid 602 on the substrate 21.

Referring to FIG. 5, the active layer 50 may further comprise a second resistor region 504 provided on the side of the second channel region 502 that is away from the first resistor region 503, and the second resistor region 504 is connected to the second channel region 502. The second resistor region 504 and the second connecting line 242 are connected by via holes provided in the first insulating layer 23, the third insulating layer and the second insulating layer. The second resistor region 504 may be formed by conductorizing the corresponding region of the active layer 50.

Because the second resistor region 504 is connected to the first resistor region 503 via the second channel region 502, and at the same time the second resistor region 504 and the second connecting line 242 are connected by the via holes, and because the voltage of the first resistor region 503 is more stable, the present implementation can further improve the stability of the voltage of the second connecting line 242, to prevent interference on the voltage of the second connecting line 242 by the other signals.

Referring to FIG. 5, the active layer 50 may further comprise a third channel region 505. Referring to FIG. 6, the grid layer 60 may further comprise a third grid 603 corresponding to the third channel region 505, and the third grid 603 and the second connecting line 242 are connected by via holes provided in the first insulating layer 23 and the third insulating layer.

The orthographic projection of the third grid 603 on the substrate 21 may cover the orthographic projection of the third channel region 505 on the substrate 21.

In the present embodiment, because the third grid 603 and the second connecting line 242 are connected by the via holes, and the voltage of the second connecting line 242 is more stable, the stability of the voltage of the third grid 603 connected to the second connecting line 242 is correspondingly increased, to prevent interference on the voltage of the third grid 603 by the other signals, whereby the turning-on and the turning-off of the third channel region 505 are more accurate, to improve the uniformity and the stability of the displaying.

Referring to FIG. 5, the active layer 50 may further comprise a third resistor region 506 connecting the third channel region 505 and the first channel region 501, and a fourth resistor region 507 provided on the side of the third channel region 505 that is away from the third resistor region 506, and the fourth resistor region 507 is connected to the third channel region 505.

The third resistor region 506 and the fourth resistor region 507 may be formed by conductorizing the corresponding regions of the active layer 50.

The second signal line 244 and the fourth resistor region 507 may be connected by via holes provided in the first insulating layer 23, the third insulating layer and the second insulating layer.

In the present implementation, the third channel region 505, the first channel region 503 and the second channel region 502, under the controlling by the scanning signals in the third grid 603, the first grid 601 and the second grid 602 respectively, write the signal in the second signal line 244 into the third grid 603 via the second connecting line 242.

In order to maintain the voltage signal on the third grid 603 constant, referring to FIGS. 6 and 7, the orthographic projection of the third grid 603 on the substrate 21 may overlap with the orthographic projection of the first electrode block 221 on the substrate 21. Accordingly, a storage capacitor is formed between the third grid 603 and the first electrode block 221. The storage capacitor is used to maintain the voltage difference between the third grid 603 and the first electrode block 221 constant, and because the first electrode block 221 is connected to a constant potential, the voltage signal on the third grid 603 can be maintained constant.

In a particular implementation, the first signal line 241 may be connected to a first data-signal input terminal, and the second signal line 244 may be connected to a second data-signal input terminal, which is not limited in the present embodiment.

In the present embodiment, the displaying base plate may be an OLED displaying base plate, which is not limited in the present embodiment.

It should be noted that the structures of all of the thin-film transistors corresponding to the first channel region 501, the second channel region 502 and the third channel region 503 described above are a top-grid structure. In a particular implementation, those thin-film transistors may also be of a bottom-grid structure. By using the top-grid structure, the spacing film layer between the third grid 603 and the first electrode block 221 is thin, which can increase the storage capacitance.

Another embodiment of the present disclosure further provides a displaying device, wherein the displaying device may comprise the displaying base plate according to any one of the above embodiments.

It should be noted that the displaying device according to the present embodiment may be any products or components that have the function of 2D or 3D displaying, such as a display panel, an electronic paper, a mobile phone, a tablet personal computer, a TV set, a notebook computer, a digital photo frame and a navigator.

The embodiments of the present disclosure provide a displaying base plate and a displaying device, wherein the displaying base plate comprises a plurality of sub-pixel units, the plurality of sub-pixel units include a first sub-pixel unit and a second sub-pixel unit that are arranged adjacently, and the displaying base plate comprises a substrate, and a first metal layer, a first insulating layer and a second metal layer that are arranged in stack on one side of the substrate; the first metal layer comprises a first electrode block, and the first electrode block is connected to a constant potential; the second metal layer comprises signal lines and connecting lines; the signal lines include a first signal line and a second signal line; the connecting lines include a first connecting line and a second connecting line; the first signal line is connected to a driving circuit of the first sub-pixel unit, the second signal line is connected to a driving circuit of the second sub-pixel unit, the first connecting line is located inside the first sub-pixel unit, and the second connecting line is located inside the second sub-pixel unit; and a shielding signal line is provided between the first signal line and the second connecting line, and the shielding signal line is connected to the first electrode block. In the technical solutions of the present disclosure, by providing the shielding signal line connected to the first electrode block, the electric potential on the shielding signal line can be a constant potential. Furthermore, because the shielding signal line is disposed between the first signal line and the second connecting line, the shielding signal line can effectively prevent formation of a coupling capacitor between the first signal line and the second connecting line, to reduce interference on the signal of the second connecting line by the first signal line, to improve the uniformity and the stability of the displaying.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The displaying base plate and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure. The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A displaying base plate, wherein the displaying base plate comprises a plurality of sub-pixel units, the plurality of sub-pixel units include a first sub-pixel unit and a second sub-pixel unit that are arranged adjacently, and the displaying base plate comprises a substrate, and a first metal layer, a first insulating layer and a second metal layer that are arranged in stack on one side of the substrate;
wherein, the first metal layer comprises a first electrode block, and the first electrode block is connected to a constant potential;
the second metal layer comprises signal lines and connecting lines; the signal lines include a first signal line and a second signal line; the connecting lines include a first connecting line and a second connecting line; the first signal line is connected to a driving circuit of the first sub-pixel unit, the second signal line is connected to a driving circuit of the second sub-pixel unit, the first connecting line is located inside the first sub-pixel unit, and the second connecting line is located inside the second sub-pixel unit; and
a shielding signal line is provided between the first signal line and the second connecting line, and the shielding signal line is connected to the first electrode block.

2. The displaying base plate according to claim 1, wherein the shielding signal line and the second metal layer are arranged in a same layer, and the shielding signal line and the first electrode block are connected by a via hole provided in the first insulating layer.

3. The displaying base plate according to claim 1, wherein the shielding signal line and the first metal layer are arranged in a same layer.

4. The displaying base plate according to claim 1, wherein an orthographic projection of the shielding signal line on the substrate does not overlaps with an orthographic projection of the signal lines on the substrate.

5. The displaying base plate according to claim 1, wherein a direction of extension of the shielding signal line and a direction of extension of the connecting lines are parallel or intersected.

6. The displaying base plate according to claim 1, wherein an orthographic projection of the shielding signal line on the substrate is a straight line or a curve line.

7. The displaying base plate according to claim 1, wherein the plurality of sub-pixel units are arranged in an array, a direction of arrangement of columns of the plurality of sub-pixel units is a first direction, and an orthographic projection in the first direction of an orthographic projection of the second connecting line on the substrate overlaps with an orthographic projection in the first direction of an orthographic projection of the shielding signal line on the substrate.

8. The displaying base plate according to claim 7, wherein the orthographic projection in the first direction of the orthographic projection of the second connecting line on the substrate is located within an area of the orthographic projection in the first direction of the orthographic projection of the shielding signal line on the substrate.

9. The displaying base plate according to claim 7, wherein in the first direction, a ratio of a length of the overlapping to a length of the orthographic projection in the first direction of the orthographic projection of the second connecting line on the substrate is greater than or equal to 0.5 and less than or equal to 0.8.

10. The displaying base plate according to claim 1, wherein the plurality of sub-pixel units are arranged in an array, a direction of arrangement of columns of the plurality of sub-pixel units is a first direction, and a length of the shielding signal line in the first direction is greater than or equal to 4 μm and less than or equal to 8 μm.

11. The displaying base plate according to claim 1, wherein the second metal layer further comprises a power signal line, and the power signal line and the first electrode block are connected by a via hole provided in the first insulating layer.

12. The displaying base plate according to claim 1, wherein the displaying base plate further comprises an active layer, a second insulating layer, a grid layer and a third insulating layer that are provided in stack between the substrate and the first metal layer, and the first metal layer is provided on one side of the third insulating layer that is away from the substrate;
wherein, the active layer comprises a first channel region, a second channel region and a first resistor region that connects the first channel region and the second channel region, the grid layer comprises a first grid corresponding to the first channel region and a second grid corresponding to the second channel region, and the first grid is connected to the second grid; and
the first metal layer further comprises a second electrode block, an orthographic projection of the second electrode block on the substrate overlaps with an orthographic projection of the first resistor region on the substrate, and the second electrode block is connected to the shielding signal line.

13. The displaying base plate according to claim 12, wherein the orthographic projection of the second electrode block on the substrate covers the orthographic projection of the first resistor region on the substrate.

14. The displaying base plate according to claim 12, wherein the active layer further comprises a second resistor region provided on one side of the second channel region that is away from the first resistor region, and the second resistor region is connected to the second channel region; and
the second resistor region and the second connecting line are connected by via holes provided in the first insulating layer, the third insulating layer and the second insulating layer.

15. The displaying base plate according to claim 14, wherein the active layer further comprises a third channel region, a third resistor region connecting the third channel region and the first channel region, and a fourth resistor region provided on one side of the third channel region that is away from the third resistor region, and the fourth resistor region is connected to the third channel region;
the grid layer further comprises a third grid corresponding to the third channel region, and the third grid and the second connecting line are connected by via holes provided in the first insulating layer and the third insulating layer; and
the second signal line and the fourth resistor region are connected by via holes provided in the first insulating layer, the third insulating layer and the second insulating layer.

16. The displaying base plate according to claim 15, wherein an orthographic projection of the third grid on the substrate overlaps with an orthographic projection of the first electrode block on the substrate.

17. A displaying device, wherein the displaying device comprises the displaying base plate according to claim 1.

18. The displaying base plate according to claim 8, wherein in the first direction, a ratio of a length of the overlapping to a length of the orthographic projection in the first direction of the orthographic projection of the second connecting line on the substrate is greater than or equal to 0.5 and less than or equal to 0.8.

19. The displaying base plate according to claim 13, wherein the active layer further comprises a second resistor region provided on one side of the second channel region that is away from the first resistor region, and the second resistor region is connected to the second channel region; and the second resistor region and the second connecting line are connected by via holes provided in the first insulating layer, the third insulating layer and the second insulating layer.

\* \* \* \* \*